(12) United States Patent
Matsushita et al.

(10) Patent No.: US 9,941,437 B2
(45) Date of Patent: Apr. 10, 2018

(54) SOLAR CELL

(71) Applicant: Panasonic Corporation, Osaka (JP)

(72) Inventors: Akio Matsushita, Kyoto (JP); Akihiro Itoh, Kyoto (JP); Tohru Nakagawa, Shiga (JP); Hidetoshi Ishida, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 973 days.

(21) Appl. No.: 14/103,083

(22) Filed: Dec. 11, 2013

(65) Prior Publication Data

US 2014/0096818 A1 Apr. 10, 2014

Related U.S. Application Data

(63) Continuation of application No. PCT/JP2013/002284, filed on Apr. 2, 2013.

(30) Foreign Application Priority Data

Apr. 12, 2012 (JP) ................................. 2012-090758

(51) Int. Cl.
*H01L 31/0687* (2012.01)
*H01L 31/054* (2014.01)
(Continued)

(52) U.S. Cl.
CPC ...... *H01L 31/0735* (2013.01); *H01L 31/0543* (2014.12); *H01L 31/06875* (2013.01);
(Continued)

(58) Field of Classification Search
CPC ............ H01L 31/0725; H01L 31/0735; H01L 31/06875; H01L 31/043; H01L 31/0687;
(Continued)

(56) References Cited

U.S. PATENT DOCUMENTS 4,278,473 A * 7/1981 Borden ............... H01L 31/0475
136/249
2003/0160251 A1* 8/2003 Wanlass .............. H01L 31/0687
257/80
(Continued)

FOREIGN PATENT DOCUMENTS

JP 2006-66765 3/2006
JP 2007-73898 3/2007
(Continued)

OTHER PUBLICATIONS

English machine translation for JP 2008-124381.*
(Continued)

*Primary Examiner* — Jeffrey T Barton
*Assistant Examiner* — Andrew Golden
(74) *Attorney, Agent, or Firm* — Wenderoth, Lind & Ponack, L.L.P.

(57) ABSTRACT

A solar cell has a condenser lens and a solar cell element, the solar cell element including an n-type InGaAs layer, an n-type GaAs layer, an n-type InGaP layer, the first InGaAs peripheral part having a thickness (d2), and a width (w2), the second InGaAs peripheral part having a thickness (d3), and a width (w3), the first GaAs peripheral part having a thickness (d5), and a width (w4), the second GaAs peripheral part a thickness (d6), and a width (w5), the first InGaP peripheral part having a thickness (d8), and a width (w6), the second InGaP peripheral part having a thickness (d9), and a width (w7), the following inequation set being satisfied: 1 nm≤(d2, d3, d5, and d6)≤4 nm, 1 nm≤(d8 and d9)≤5 nm, 100 nm≤(w2, w3, w4, w5, w6, and w7), the InGaAs center part having a thickness (w1), a window layer has a range S irradiated by sunlight having a width (w8); w8≤w1.

4 Claims, 8 Drawing Sheets

(51) Int. Cl.
  *H01L 31/0236* (2006.01)
  *H01L 31/0735* (2012.01)
  *H01L 31/0725* (2012.01)

(52) U.S. Cl.
  CPC .......... *H01L 31/0725* (2013.01); *Y02E 10/52* (2013.01); *Y02E 10/544* (2013.01)

(58) Field of Classification Search
  CPC ............. H01L 31/0475; H01L 31/0693; H01L 31/03046; H01L 31/0352
  USPC .................................................. 136/243–265
  See application file for complete search history.

(56) References Cited

U.S. PATENT DOCUMENTS

| | | | | |
|---|---|---|---|---|
| 2006/0144435 A1* | 7/2006 | Wanlass | ............ | H01L 31/06875 136/249 |
| 2006/0162768 A1* | 7/2006 | Wanlass | ............ | H01L 31/06875 136/262 |
| 2012/0301993 A1 | 11/2012 | Matsushita et al. | | |

FOREIGN PATENT DOCUMENTS

| | | |
|---|---|---|
| JP | 2008-124381 | 5/2008 |
| JP | 2010-10704 | 1/2010 |
| JP | 5136730 | 11/2012 |

OTHER PUBLICATIONS

International Search Report (ISR) dated Jun. 4, 2013 in International (PCT) Application No. PCT/JP2013/002284.

Jenny Nelson, "The Physics of Solar Cells", World Scientific Pub. Co., Downloaded from www.worldscientific.com by 125.53.27.116 on Nov. 27, 2013.

Notification of Transmittal of Translation of the International Preliminary Report on Patentability (IPROP) dated Oct. 23, 2014 in International (PCT) Application No. PCT/JP2013/002284, together with IPROP and translation of Written Opinion.

* cited by examiner

| | | |
|---|---|---|
| p | GaAs | — B10 ⎫ |
| p | InP | — B9 ⎪ |
| p | InGaAs | — B8  ⎬ B |
| n | InGaAs | — B7 ⎪ |
| n | InP | — B6 ⎭ |
| n | GaAs | — 8 |
| p | GaAs | — 6 |
| p | InGaP | — M4 ⎫ |
| p | GaAs | — M3 ⎬ M |
| n | GaAs | — M2 ⎪ |
| n | AlInP | — M1 ⎭ |
| n | InGaP | — 7 |
| p | AlGaAs | — 5 |
| p | AlInP | — T5 ⎫ |
| p | InGaP | — T4 ⎪ |
| n | InGaP | — T3 ⎬ T |
| n | AlInP | — T2 ⎪ |
| n | GaAs | — T1 ⎭ |
| n | AlAs | — 4 |
| n | GaAs-sub | — 1 |

Prior Art

SOLAR CELL

CROSS-REFERENCE TO RELATED APPLICATIONS

This is a continuation application of International Application No. PCT/JP2013/002284, with an international filing date of Apr. 2, 2013, which claims priority of Japanese Patent Application No. 2012-90758 filed on Apr. 12, 2012, the contents of which is incorporated herein by reference.

BACKGROUND OF THE INVENTION (1) Field of the Invention

The present disclosure relates to a solar cell.

(2) Description of Related Art

FIG. 7 shows a solar cell disclosed in Patent Literature 1 (Japanese Patent Laid-Open Publication No. 2008-124381). This solar cell comprises a solar cell element 11 and an optical lens L. The solar cell element 11 comprises a p-type GaAs buffer layer 13a, a p-type InGaP-BSF layer 13b, a p-type GaAs base layer 13c, an n-type GaAs emitter layer 13d, an n-type InGaP window layer 13e, and an anti-reflection layer 15. These layers 13a-15 are stacked in this order on a semiconductor substrate 12.

The n-type InGaP window layer 13e is irradiated with sunlight which passes through the optical lens L and the anti-reflection layer 15. This irradiation of sunlight generates an electric power.

FIG. 8 shows a solar cell element disclosed in Patent Literature 2 (Japanese Patent Laid-Open Publication No. 2010-010704). This solar cell element comprises a top cell T formed of InGaP, a middle cell formed of GaAs, and a bottom cell formed of InGaAs. These three cells T, M, and B are electrically connected through tunnel junction layers 5-8. The top cell T, the middle cell M, and the bottom cell B absorb lights having a different wavelength from each other to generate an electric power. For this reason, this solar cell element has high photoelectric conversion efficiency.

SUMMARY

A solar cell obtained by equipping the lens with the solar cell element disclosed in Patent Literature 2 has photoelectric conversion efficiency of approximately 30.5%.

One non-limiting and exemplary embodiments provides a solar cell having higher photoelectric conversion efficiency.

In one general aspect, the techniques disclosed here feature: a method for generating an electric power using a solar cell, the method including:

(a) preparing the solar cell comprising a condenser lens 101 and a solar cell element 102;

wherein the solar cell element 102 comprises an n-type InGaAs layer 104, a p-type InGaAs layer 103, an n-type GaAs layer 106, a p-type GaAs layer 105, an n-type InGaP layer 108, a p-type InGaP layer 107, a first tunnel junction layer 110, a second tunnel junction layer 111, a window layer 109, an n-side electrode 120, and a p-side electrode 121;

Z direction is a normal line direction of the p-type InGaAs layer 103;

X direction is perpendicular to the Z direction;

the n-type InGaAs layer 104, the p-type InGaAs layer 103, the first tunnel junction layer 110, the n-type GaAs layer 106, the p-type GaAs layer 105, the second tunnel junction layer 111, the n-type InGaP layer 108, the p-type InGaP layer 107, and the window layer 109 are stacked in this order along the Z direction;

the n-side electrode 120 is connected electrically to the n-type InGaAs layer 104;

the p-side electrode 121 is connected electrically to the p-type InGaP layer 107;

the n-type InGaAs layer 104 is divided into an InGaAs center part 104a, a first InGaAs peripheral part 104b, and a second InGaAs peripheral part 104c;

the InGaAs center part 104a is interposed between the first InGaAs peripheral part 104b and the second InGaAs peripheral part 104c along the X direction;

the first InGaAs peripheral part 104b and the second InGaAs peripheral part 104c have a shape of a layer;

the n-type GaAs layer 106 is divided into a GaAs center part 106a, a first GaAs peripheral part 106b, and a second GaAs peripheral part 106c;

the GaAs center part 106a is interposed between the first GaAs peripheral part 106b and the second GaAs peripheral part 106c along the X direction;

the first GaAs peripheral part 106b and the second GaAs peripheral part 106c have a shape of a layer;

the n-type InGaP layer 108 is divided into an InGaP center part 108a, a first InGaP peripheral part 108b, and a second InGaP peripheral part 108c;

the InGaP center part 108a is interposed between the first InGaP peripheral part 108b and the second InGaP peripheral part 108c along the X direction;

the first InGaP peripheral part 108b and the second InGaP peripheral part 108c have a shape of a layer;

the following inequation set (I) is satisfied;

$d2 < d1$,
$d3 < d1$,
1 nanometer $\leq d2 \leq 4$ nanometers,
1 nanometer $\leq d3 \leq 4$ nanometers,
$d5 < d4$,
$d6 < d4$,
1 nanometer $\leq d5 \leq 4$ nanometers,
1 nanometer $\leq d6 \leq 4$ nanometers,
$d8 < d7$,
$d9 < d7$,
1 nanometer $\leq d8 \leq 5$ nanometers,
1 nanometer $\leq d9 \leq 5$ nanometers,
100 nanometers $\leq w2$,
100 nanometers $\leq w3$,
100 nanometers $\leq w4$,
100 nanometers $\leq w5$,
100 nanometers $\leq w6$, and
100 nanometers $\leq w7$ d1 represents a thickness of the InGaAs center part 104a along the Z direction;

d2 represents a thickness of the first InGaAs peripheral part 104b along the Z direction;

d3 represents a thickness of the second InGaAs peripheral part 104c along the Z direction;

d4 represents a thickness of the GaAs center part 106a along the Z direction;

d5 represents a thickness of the first GaAs peripheral part 106b along the Z direction;

d6 represents a thickness of the second GaAs peripheral part 106c along the Z direction;

d7 represents a thickness of the InGaP center part 108a along the Z direction;

d8 represents a thickness of the first InGaP peripheral part 108b along the Z direction;

d9 represents a thickness of the second InGaP peripheral part 108c along the Z direction;

w2 represents a width of the first InGaAs peripheral part 104b along the X direction;

w3 represents a width of the second InGaAs peripheral part 104c along the X direction;

w4 represents a width of the first GaAs peripheral part 106b along the X direction;

w5 represents a width of the second GaAs peripheral part 106c along the X direction;

w6 represents a width of the first InGaP peripheral part 18b along the X direction; w7 represents a width of the second InGaP peripheral part 108c along the X direction;

(b) irradiating a region S which is included in the surface of the window layer 109 through the condenser lens 101 with light in such a manner that the following inequation (II) is satisfied so as to generate a voltage difference between the n-side electrode 120 and the p-side electrode 121;

w8≤w1 (II)

where, w1 represents a width of the InGaAs center part 104a along the X direction;

w8 represents a width of the range S along the X direction when viewed in the cross-sectional view which includes the Z direction; and the first center part 104a overlaps the region S when viewed from the Z-direction.

The present disclosure provides a solar cell having higher photoelectric conversion efficiency.

Additional benefits and advantages of the disclosed embodiments will be apparent from the specification and figures. The benefits and/or advantages may be individually provided by the various embodiments and features of the specification and drawings disclosure, and need not all be provided in order to obtain one or more of the same.

BRIEF DESCRIPTION OF DRAWINGS

The present disclosure will become readily understood from the following description of non-limiting and exemplary embodiments thereof made with reference to the accompanying drawings, in which like parts are designated by like reference numeral and in which:

FIG. 8 shows a cross-sectional view of the solar cell disclosed in Patent Literature 2 (Japanese Patent Laid-Open Publication No. 2010-010704).

DETAILED DESCRIPTION

Figure 1A:
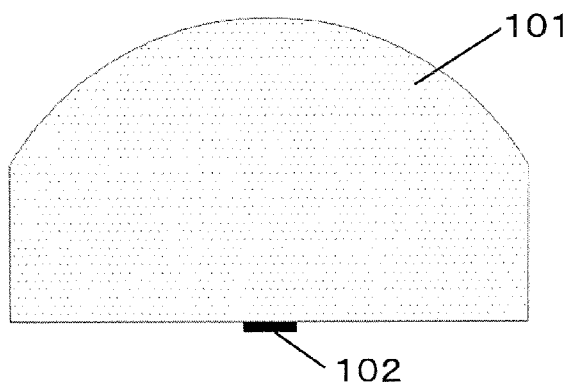
FIG. 1A shows a cross-sectional view of the solar cell according to the embodiment.

According to a first aspect, a method for generating an electric power using a solar cell, the method includes:

(a) preparing the solar cell comprising a condenser lens 101 and a solar cell element 102;

wherein the solar cell element 102 comprises an n-type InGaAs layer 104, a p-type InGaAs layer 103, an n-type GaAs layer 106, a p-type GaAs layer 105, an n-type InGaP layer 108, a p-type InGaP layer 107, a first tunnel junction layer 110, a second tunnel junction layer 111, a window layer 109, an n-side electrode 120, and a p-side electrode 121;

Z direction is a normal line direction of the p-type InGaAs layer 103;

X direction is perpendicular to the Z direction;

the n-type InGaAs layer 104, the p-type InGaAs layer 103, the first tunnel junction layer 110, the n-type GaAs layer 106, the p-type GaAs layer 105, the second tunnel junction layer 111, the n-type InGaP layer 108, the p-type InGaP layer 107, and the window layer 109 are stacked in this order along the Z direction;

the n-side electrode 120 is connected electrically to the n-type InGaAs layer 104;

the p-side electrode 121 is connected electrically to the p-type InGaP layer 107;

the n-type InGaAs layer 104 is divided into an InGaAs center part 104a, a first InGaAs peripheral part 104b, and a second InGaAs peripheral part 104c; the InGaAs center part 104a is interposed between the first InGaAs peripheral part 104b and the second InGaAs peripheral part 104c along the X direction;

the first InGaAs peripheral part 104b and the second InGaAs peripheral part 104c have a shape of a layer;

the n-type GaAs layer 106 is divided into a GaAs center part 106a, a first GaAs peripheral part 106b, and a second GaAs peripheral part 106c;

the GaAs center part 106a is interposed between the first GaAs peripheral part 106b and the second GaAs peripheral part 106c along the X direction;

the first GaAs peripheral part 106b and the second GaAs peripheral part 106c have a shape of a layer;

the n-type InGaP layer 108 is divided into an InGaP center part 108a, a first InGaP peripheral part 108b, and a second InGaP peripheral part 108c;

the InGaP center part 108a is interposed between the first InGaP peripheral part 108b and the second InGaP peripheral part 108c along the X direction;

the first InGaP peripheral part 108b and the second InGaP peripheral part 108c have a shape of a layer;

the following inequation set (I) is satisfied;
(I)
d2<d1,
d3<d1,
1 nanometer≤d2≤4 nanometers,
1 nanometer≤d3≤4 nanometers,
d5<d4,
d6<d4,
1 nanometer≤d5≤4 nanometers,
1 nanometer≤d6≤4 nanometers,
d8<d7,
d9<d7,
1 nanometer≤d8≤5 nanometers,
1 nanometer≤d9≤5 nanometers,
100 nanometers≤w2,
100 nanometers≤w3,
100 nanometers≤w4,
100 nanometers≤w5,
100 nanometers≤w6, and
100 nanometers≤w7 d1 represents a thickness of the InGaAs center part 104a along the Z direction;
d2 represents a thickness of the first InGaAs peripheral part 104b along the Z direction;
d3 represents a thickness of the second InGaAs peripheral part 104c along the Z direction;
d4 represents a thickness of the GaAs center part 106a along the Z direction;
d5 represents a thickness of the first GaAs peripheral part 106b along the Z direction;
d6 represents a thickness of the second GaAs peripheral part 106c along the Z direction;
d7 represents a thickness of the InGaP center part 108a along the Z direction;
d8 represents a thickness of the first InGaP peripheral part 108b along the Z direction;
d9 represents a thickness of the second InGaP peripheral part 108c along the Z direction;
w2 represents a width of the first InGaAs peripheral part 104b along the X direction;
w3 represents a width of the second InGaAs peripheral part 104c along the X direction;
w4 represents a width of the first GaAs peripheral part 106b along the X direction;
w5 represents a width of the second GaAs peripheral part 106c along the X direction;
w6 represents a width of the first InGaP peripheral part 108b along the X direction;
w7 represents a width of the second InGaP peripheral part 108c along the X direction;
(b) irradiating a region S which is included in the surface of the window layer 109 through the condenser lens 101 with light in such a manner that the following inequation (II) is satisfied so as to generate a voltage difference between the n-side electrode 120 and the p-side electrode 121;
w8≤w1 (II)
where, w1 represents a width of the InGaAs center part 104a along the X direction;
w8 represents a width of the range S along the X direction when viewed in the cross-sectional view which includes the Z direction; and the first center part 104a overlaps the region S when viewed from the Z-direction.

Further, as a method of a second aspect, in the first aspect, the following equation is satisfied:

$$w1+w2+w3+w4+w5+w6+w7=w8+w9+w10$$

where, w9 and the width w10 represent widths of portions of the window layer 109 which are not irradiated with the light.

Further, as a method of a third aspect, in the first aspect, sides of the n-type InGaAs layer 104, the p-type InGaAs layer 103, the first tunnel junction layer 110, the n-type GaAs layer 106, the p-type GaAs layer 105, the second tunnel junction layer 111, the n-type InGaP layer 108, the p-type InGaP layer 107 and the p-type window layer 109 are covered with an insulation layer 121.

According to a fourth aspect, a solar cell includes a condenser lens 101 and a solar cell element 102,
wherein the solar cell element 102 includes an n-type InGaAs layer 104, a p-type InGaAs layer 103, an n-type GaAs layer 106, a p-type GaAs layer 105, an n-type InGaP layer 108, a p-type InGaP layer 107, a first tunnel junction layer 110, a second tunnel junction layer 111, a window layer 109, an n-side electrode 120, and a p-side electrode 121;
Z direction is a normal line direction of the p-type InGaAs layer 103;
X direction is perpendicular to the Z direction;
the n-type InGaAs layer 104, the p-type InGaAs layer 103, the first tunnel junction layer 110, the n-type GaAs layer 106, the p-type GaAs layer 105, the second tunnel junction layer 111, the n-type InGaP layer 108, the p-type InGaP layer 107, and the window layer 109 are stacked in this order along the Z direction;
the n-side electrode 120 is connected electrically to the n-type InGaAs layer 104;
the p-side electrode 121 is connected electrically to the p-type InGaP layer 107;
the n-type InGaAs layer 104 is divided into an InGaAs center part 104a, a first InGaAs peripheral part 104b, and a second InGaAs peripheral part 104c;
the InGaAs center part 104a is interposed between the first InGaAs peripheral part 104b and the second InGaAs peripheral part 104c along the X direction;
the first InGaAs peripheral part 104b and the second InGaAs peripheral part 104c have a shape of a layer;
the n-type GaAs layer 106 is divided into a GaAs center part 106a, a first GaAs peripheral part 106b, and a second GaAs peripheral part 106c;
the GaAs center part 106a is interposed between the first GaAs peripheral part 106b and the second GaAs peripheral part 106c along the X direction;
the first GaAs peripheral part 106b and the second GaAs peripheral part 106c have a shape of a layer;
the n-type InGaP layer 108 is divided into an InGaP center part 108a, a first InGaP peripheral part 108b, and a second InGaP peripheral part 108c;
the InGaP center part 108a is interposed between the first InGaP peripheral part 108b and the second InGaP peripheral part 108c along the X direction;
the first InGaP peripheral part 108b and the second InGaP peripheral part 108c have a shape of a layer;
the following inequation set (I) is satisfied;
(I)
d2<d1,
d3<d1,
1 nanometer≤d2≤4 nanometers,
1 nanometer≤d3≤4 nanometers,
d5<d4,
d6<d4,
1 nanometer≤d5≤4 nanometers,
1 nanometer≤d6≤4 nanometers,
d8<d7,
d9<d7, 1 nanometer≤d8≤5 nanometers,
1 nanometer≤d9≤5 nanometers,
100 nanometers≤w2,
100 nanometers≤w3,
100 nanometers≤w4,
100 nanometers≤w5,
100 nanometers≤w6, and
100 nanometers≤w7 d1 represents a thickness of the InGaAs center part 104a along the Z direction;

d2 represents a thickness of the first InGaAs peripheral part 104b along the Z direction;

d3 represents a thickness of the second InGaAs peripheral part 104c along the Z direction;

d4 represents a thickness of the GaAs center part 106a along the Z direction;

d5 represents a thickness of the first GaAs peripheral part 106b along the Z direction;

d6 represents a thickness of the second GaAs peripheral part 106c along the Z direction;

d7 represents a thickness of the InGaP center part 108a along the Z direction;

d8 represents a thickness of the first InGaP peripheral part 108b along the Z direction;

d9 represents a thickness of the second InGaP peripheral part 108c along the Z direction;

w2 represents a width of the first InGaAs peripheral part 104b along the X direction;

w3 represents a width of the second InGaAs peripheral part 104c along the X direction;

w4 represents a width of the first GaAs peripheral part 106b along the X direction, w5 represents a width of the second GaAs peripheral part 106c along the X direction;

w6 represents a width of the first InGaP peripheral part 108b along the X direction;

w7 represents a width of the second InGaP peripheral part 108c along the X direction.

The embodiment of the present disclosure is described below with reference to the drawings.

Embodiment (Step (a))

In the step (a), a solar cell is prepared.

FIG. 1A shows a cross-sectional view of the solar cell according to the embodiment. As shown in FIG. 1A, the solar cell comprises a condenser lens 101 and a solar cell element 102.

Figure 1B:
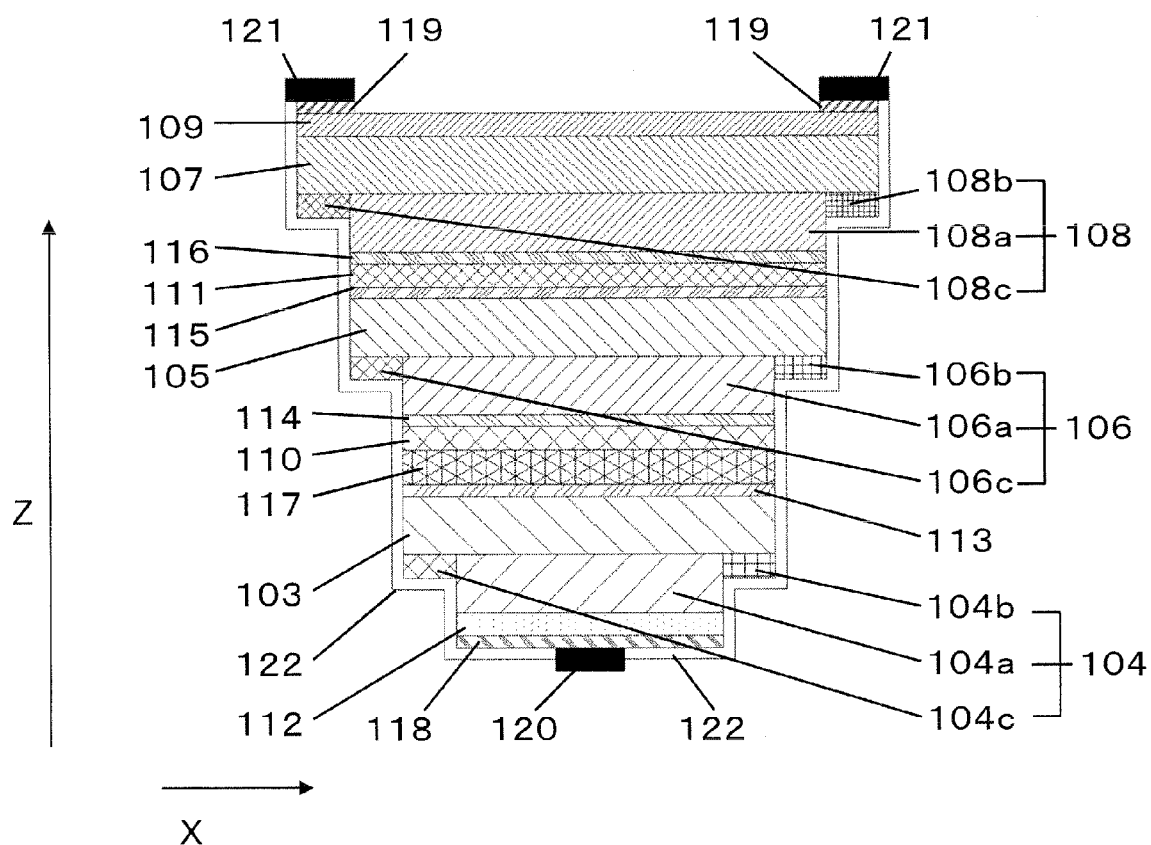
FIG. 1B shows a cross-sectional view of the solar cell element according to the embodiment.

FIG. 1B shows a cross-sectional view of the solar cell element 102 according to the embodiment. As shown in FIG. 1B, the solar cell element 102 comprises an n-type InGaAs layer 104, a p-type InGaAs layer 103, an n-type GaAs layer 106, a p-type GaAs layer 105, an n-type InGaP layer 108, a p-type InGaP layer 107, a first tunnel junction layer 110, a second tunnel junction layer 111, a window layer 109, an n-side electrode 120, and an p-side electrode 121.

The p-type InGaAs layer 103 is stacked on the n-type InGaAs layer 104. The p-type GaAs layer 105 is stacked on the n-type GaAs layer 106. The p-type InGaP layer 107 is stacked on the n-type InGaP layer 108. The Z direction is a lamination direction. In other words, the Z direction is parallel to a normal line direction of the p-type InGaAs layer 103.

Along the Z direction, the first tunnel junction layer 110 is interposed between the p-type InGaAs layer 103 and the n-type GaAs layer 106. Along the Z direction, the second tunnel junction layer 111 is interposed between the p-type GaAs layer 105 and the n-type InGaP layer 108.

The p-side electrode 121 is electrically connected to the p-type InGaP layer 107. The n-side electrode 120 is electrically connected to the n-type InGaAs layer 104.

Along the Z direction, it is desirable that a first n-type barrier layer 112 and an n-type electric contact layer 118 are interposed between the n-type InGaAs layer 104 and the n-side electrode 120. Along the Z direction, the first n-type barrier layer 112 is interposed between the n-type InGaAs layer 104 and the n-type electric contact layer 118. Along the Z direction, the n-type electric contact layer 118 is interposed between the first n-type barrier layer 112 and the n-side electrode 120.

Along the Z direction, it is desirable that the first p-type barrier layer 113 is interposed between the p-type InGaAs layer 103 and the first tunnel junction layer 110. Along the Z direction, it is desirable that the second n-type barrier layer 114 is interposed between the n-type GaAs layer 106 and the first tunnel junction layer 110.

Along the Z direction, it is desirable that the second p-type barrier layer 115 is interposed between the p-type GaAs layer 105 and the second tunnel junction layer 111. Along the Z direction, it is desirable that the third n-type barrier layer 116 is interposed between the n-type InGaP layer 108 and the second tunnel junction layer 111.

Along the Z direction, it is desirable that a p-type electric contact layer 119 is interposed between the window layer 109 and the p-side electrode 121. The p-side electrode 121, the p-type electric contact layer 119, the window layer 109, the p-type InGaP layer 107, the n-type InGaP layer 108, the third n-type barrier layer 116, the second tunnel junction layer 111, the second p-type barrier layer 115, the p-type GaAs layer 105, the n-type GaAs layer 106, the second n-type barrier layer 114, the first tunnel junction layer 110, the first p-type barrier layer 113, the p-type InGaAs layer 103, the n-type InGaAs layer 104, the first n-type barrier layer 112, the n-type electric contact layer 118, and the n-side electrode 120 are electrically connected serially in this order.

As shown in FIG. 1B, the n-type in GaAs layer 104 is divided into an InGaAs center part 104a, a first InGaAs peripheral part 104b, and a second InGaAs peripheral part 104c. The InGaAs center part 104a is interposed between the first InGaAs peripheral part 104b and the second InGaAs peripheral part 104c along the X direction. The X direction is perpendicular to the Z direction.

As shown in FIG. 1B, the n-type GaAs layer 106 is divided in a GaAs center part 106a, a first GaAs peripheral part 106b, and second GaAs peripheral part 106c. The GaAs center part 106a is interposed between the first GaAs peripheral part 106b and the second GaAs peripheral part 106c along the X direction.

As shown in FIG. 1B, the n-type InGaP layer 108 is divided in a InGaP layer center part 108a, a first InGaP peripheral part 108b, and a second InGaP peripheral part 108c. The InGaP center part 108a is interposed between the first InGaP peripheral part 108b and the second InGaP peripheral part 108c along the X direction.

Figure 2:
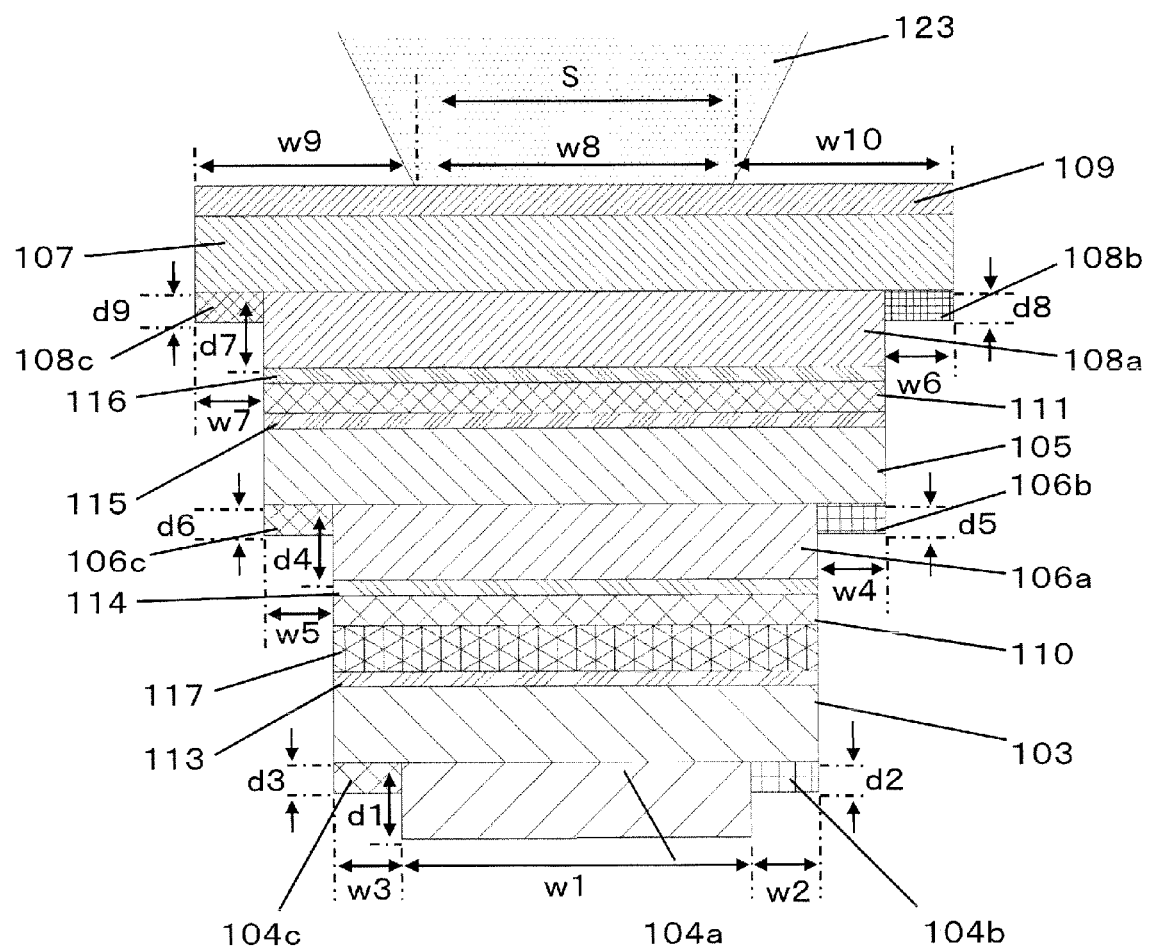
FIG. 2 shows an enlarged cross-sectional view of the solar cell element according to the embodiment.

As shown in FIG. 2, the thickness d1 of the InGaAs center part 104a is greater than the thickness d2 of the first InGaAs peripheral part 104b and than the thickness d3 of the second InGaAs peripheral part 104c. In case where the thickness d1 is identical to the thickness d2 and the thickness d3, the higher photoelectric conversion efficiency is not achieved (See the comparative examples 1 and 2, which are described later).

As shown in FIG. 2, the thickness d4 of the GaAs center part 106a is greater than the thickness d5 of the first GaAs peripheral part 106b and than the thickness d6 of the second GaAs peripheral part 106c. In case where the thickness d4 is identical to the thickness d5 and the thickness d6, the higher photoelectric conversion efficiency is not achieved (See the comparative examples 1 and 2, which are described later).

As shown in FIG. 2, the thickness d7 of the InGaP center part 108a is greater than the thickness d8 of the first InGaP peripheral part 108b and than thickness d9 of the second InGaP peripheral part 108c. In case where the thickness d7 is identical to the thickness d8 and thickness d9, the higher photoelectric conversion efficiency is not achieved (See the comparative examples 1 and 2, which are described later).

The thickness d2 is not less than 1 nanometer and not more than 4 nanometers. In case where the thickness d2 is less than 1 nanometer, the higher photoelectric conversion efficiency is not achieved (See the comparative example 7, which is described later). In case where the thickness d2 is more than 4 nanometers, the higher photoelectric conversion efficiency is not achieved (See the comparative examples 4-6, which are described later). Similarly, the thickness d3 is also not less than 1 nanometer and not more than 4 nanometers.

The thickness d5 is not less than 1 nanometer and not more than 4 nanometers. In case where the thickness d5 is less than 1 nanometer, the higher photoelectric conversion efficiency is not achieved (See the comparative example 11, which is described later). In case where the thickness d5 is more than 4 nanometers, the higher photoelectric conversion efficiency is not achieved (See the comparative examples 8-10, which are described later). Similarly, the thickness d6 is also not less than 1 nanometer and not more than 4 nanometers.

The thickness d8 is not less than 1 nanometer and not more than 5 nanometers.

In case where the thickness d8 is less than 1 nanometer, the higher photoelectric conversion efficiency is not achieved (See the comparative example 14, which is described later). In case where the thickness d8 is more than 5 nanometers, the higher photoelectric conversion efficiency is not achieved (See the comparative examples 12-13, which are described later). Similarly, the thickness d9 is also not less than 1 nanometer and not more than 5 nanometers.

As shown in FIG. 2, the InGaAs center part 104a has a width w1. The first InGaAs peripheral part 104b has a width w2. The second InGaAs peripheral part 104c has a width w3. The value of w2 is not less than 0.1 micrometer. In case where the value of w2 is smaller than 0.1 micrometer, the photoelectric conversion efficiency is decreased (See the comparative example 15, which is described later). For the similarly reason, the value of w3 is not less than 0.1 micrometer.

As shown in FIG. 2, the GaAs center part 106a has a width of (w1+w2+w3). The first GaAs peripheral part 106b has a width w4. The second GaAs peripheral part 106c has a width w5. The value of w4 is not less than 0.1 micrometer. In case where the value of w4 is smaller than 0.1 micrometer, the photoelectric conversion efficiency is decreased (See the comparative example 16, which is described later). For the similarly reason, the value of w5 is not less than 0.1 micrometer.

As shown in FIG. 2, the InGaP center part 108a has a width of (w1+w2+w3+w4+w5). The first InGaP peripheral part 108b has a width w6. The second InGaP peripheral part 108c has a width w7. The value of w6 is not less than 0.1 micrometer. In case where the value of w6 is smaller than 0.1 micrometer, the photoelectric conversion efficiency is decreased (See the comparative example 17, which is described later). For the similarly reason, the value of w7 is not less than 0.1 micrometer.

Accordingly, in the embodiment, it is necessary that the following inequation set (I) is satisfied.

(I)
$d2<d1$,
$d3<d1$,
1 nanometer$\leq d2 \leq$4 nanometers,
1 nanometer$\leq d3 \leq$4 nanometers,
$d5<d4$,
$d6<d4$,
1 nanometer$\leq d5 \leq$4 nanometers,
1 nanometer$\leq d6 \leq$4 nanometers,
$d8<d7$,
$d9<d7$,
1 nanometer$\leq d8 \leq$5 nanometers,
1 nanometer$\leq d9 \leq$5 nanometers,
100 nanometers$\leq w2$,
100 nanometers$\leq w3$,
100 nanometers$\leq w4$,
100 nanometers$\leq w5$,
100 nanometers$\leq w6$, and
100 nanometers$\leq w7$, As described above, the value of d1 represents the thickness of the InGaAs center part 104a along the Z direction.

The value of d2 represents the thickness of the first InGaAs peripheral part 104b along the Z direction.

The value of d3 represents the thickness of the second InGaAs peripheral part 104c along the Z direction.

The value of d4 represents the thickness of the GaAs center part 106a along the Z direction.

The value of d5 represents the thickness of the first GaAs peripheral part 106b along the Z direction.

The value of d6 represents the thickness of the second GaAs peripheral part 106c along the Z direction.

The value of d7 represents the thickness of the InGaP center part 108a along the Z direction.

The value of d8 represents the thickness of the first InGaP peripheral part 108b along the Z direction.

The value of d9 represents the thickness of the second InGaP peripheral part 108c along the Z direction.

The value of w2 represents the width of the first InGaAs peripheral part 104b along the X direction.

The value of w3 represents the width of the second InGaAs peripheral part 104c along the X direction.

The value of w4 represents the width of the first GaAs peripheral part 106b along the X direction.

The value of w5 represents the width of the second GaAs peripheral part 106c along the X direction.

The value of w6 represents the width of the first InGaP peripheral part 108b along the X direction.

The value of w7 represents the width of the second InGaP peripheral part 108c along the X direction.

The obverse surface of the condenser lens 101 is irradiated with light. This is described in more detail in the step (b), which is described later. Sunlight is desirable.

It is desirable that the reverse surface of the condenser lens 101 is in contact with the solar cell element 102. The light is focused onto the window layer 109 by the condenser lens 101. It is desirable that the condenser lens 101 has a diameter of 2 millimeters-10 millimeters, a thickness of 2 millimeter-10 millimeters, and a refractive index of 1.1-2.0.

The material of the condenser lens 101 is not limited. An example of the material of the condenser lens 101 is glass or resin.

The window layer 109 is made of a p-type compound semiconductor having a lattice constant close to that of InGaP and having a wider bandgap than InGaP. An example of the material of the window layer 109 is p-type InAlGaP or p-type InAlP.

The first n-type barrier layer 112 is made of an n-type compound semiconductor having a lattice constant close to that of InGaAs and having a wider bandgap than InGaAs. An example of the material of the first n-type barrier layer 112 is n-type InGaP or n-type InP.

The second n-type barrier layer 114 is made of an n-type compound semiconductor having a lattice constant close to that of GaAs and having a wider bandgap than GaAs. An example of the material of the second n-type barrier layer 114 is n-type InGaP or n-type AlGaAs.

The third n-type barrier layer 116 is made of an n-type compound semiconductor having a lattice constant close to that of InGaP and having a wider bandgap than InGaP. An example of the material of the third n-type barrier layer 116 is n-type InAlGaP or n-type InAlP.

The first p-type barrier layer 113 is made of a p-type compound semiconductor having a lattice constant close to that of InGaAs and having a wider bandgap than InGaAs. An example of the material of the first p-type barrier layer 113 is p-type InGaP or p-type InP.

The second p-type barrier layer 115 is made of a p-type compound semiconductor having a lattice constant close to that of GaAs and having a wider bandgap than GaAs. An example of the material of the second p-type barrier layer 115 is p-type InGaP or p-type AlGaAs.

The first tunnel junction layer 110 is composed of two thin semiconductor layers which form pn-junction. In other words, the first tunnel junction layer 110 is composed of a p-type semiconductor layer (not illustrated) and an n-type semiconductor layer (not illustrated). This p-type semiconductor layer is stacked on this n-type semiconductor layer. These two semiconductor layers are doped at a high concentration. These two semiconductor layers have a lattice constant which is close to that of GaAs. An example of the material of the first tunnel junction layer 110 is GaAs, InGaP, or AlGaAs.

Similarly to the first tunnel junction layer 110, the second tunnel junction layer 111 is also composed of the two thin semiconductor layers which form pn-junction. In other words, the second tunnel junction layer 111 is also composed of a p-type semiconductor layer (not illustrated) and an n-type semiconductor layer (not illustrated). This p-type semiconductor layer is stacked on this n-type semiconductor layer. These two semiconductor layers are doped at a high concentration. These two semiconductor layers have a lattice constant which is close to that of GaAs or InGaP. An example of the material of the second tunnel junction layer 111 is GaAs, InGaP, or AlGaAs.

A buffer layer 117 cancels a lattice mismatch between the p-type InGaAs layer 103 and the n-type GaAs layer 106. An example of the buffer layer 117 is $In_{1-x}Ga_xP$ layer. Here, the value of x gradually decreases from the p-type InGaAs layer 103 toward the n-type GaAs layer 106. As one example, a portion of the buffer layer 117 which is in contact with the p-type InGaAs layer 103 is $In_{1-x}Ga_xP$ layer (x=0.51), whereas a portion of the buffer layer 117 which is in contact with the n-type GaAs layer 106 is $In_{1-x}Ga_xP$ layer (x=0.22).

As long as an ohmic contact is formed in the interface with the window layer 109 and in the interface with the p-side electrode 121, a material of the p-type contact layer 119 is not limited. An example of the material of the p-type electric contact layer 119 is p-type GaAs.

As long as an ohmic contact is formed in the interface with the first n-type barrier layer 112 and in the interface with the n-side electrode 120L, a material of the n-type contact layer 119 is not limited. An example of the material of the n-type electric contact layer 118 is n-type GaAs.

As shown in FIG. 1B, for example, the sides of the layers 103 to 109 are covered with an insulation film 122. An example of the material of the insulation film 122 is non-doped InGaP, silicon dioxide, or silicon nitride.

Figure 5:
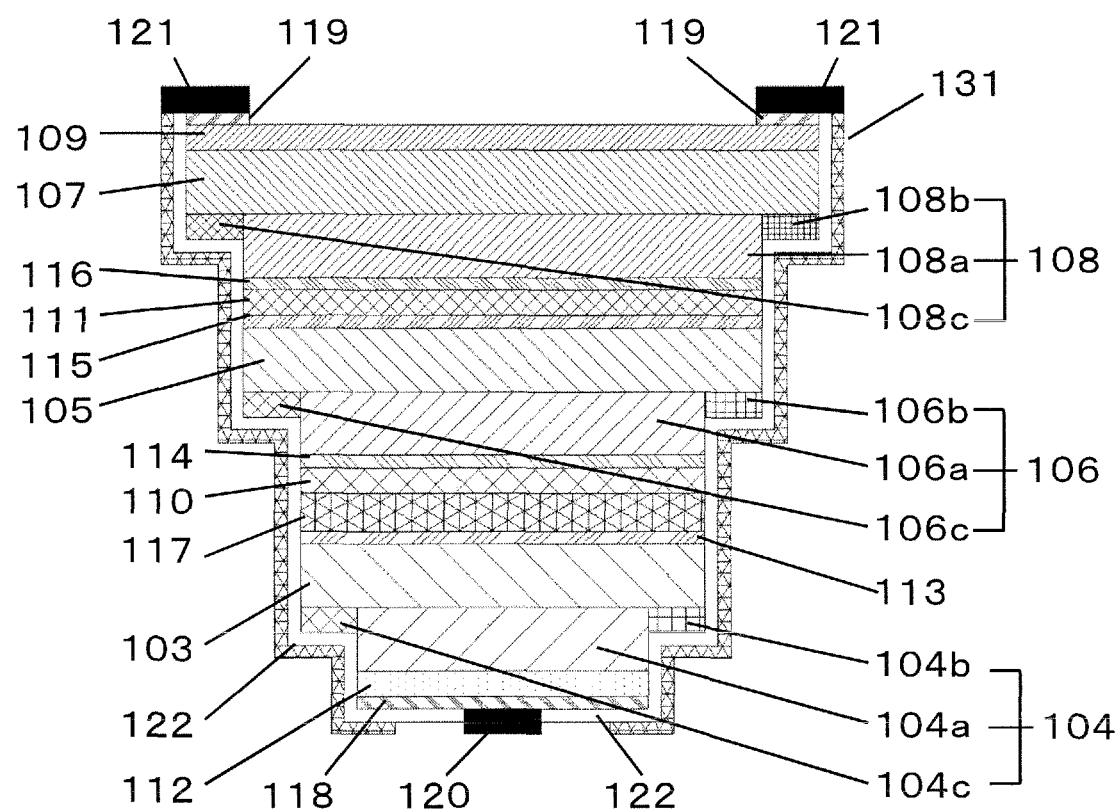
FIG. 5 shows a cross-sectional view of the solar cell element according to the embodiment.
Figure 6:
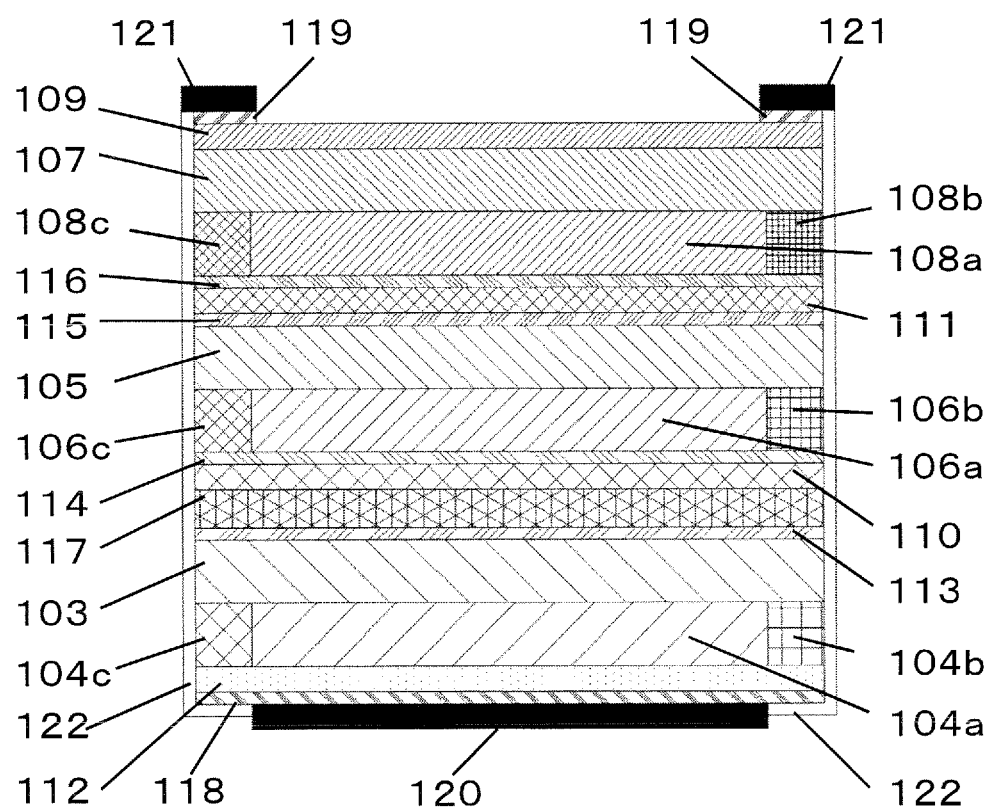
FIG. 6 shows a cross-sectional view of the solar cell element according to the comparative example 1.
Figure 7:
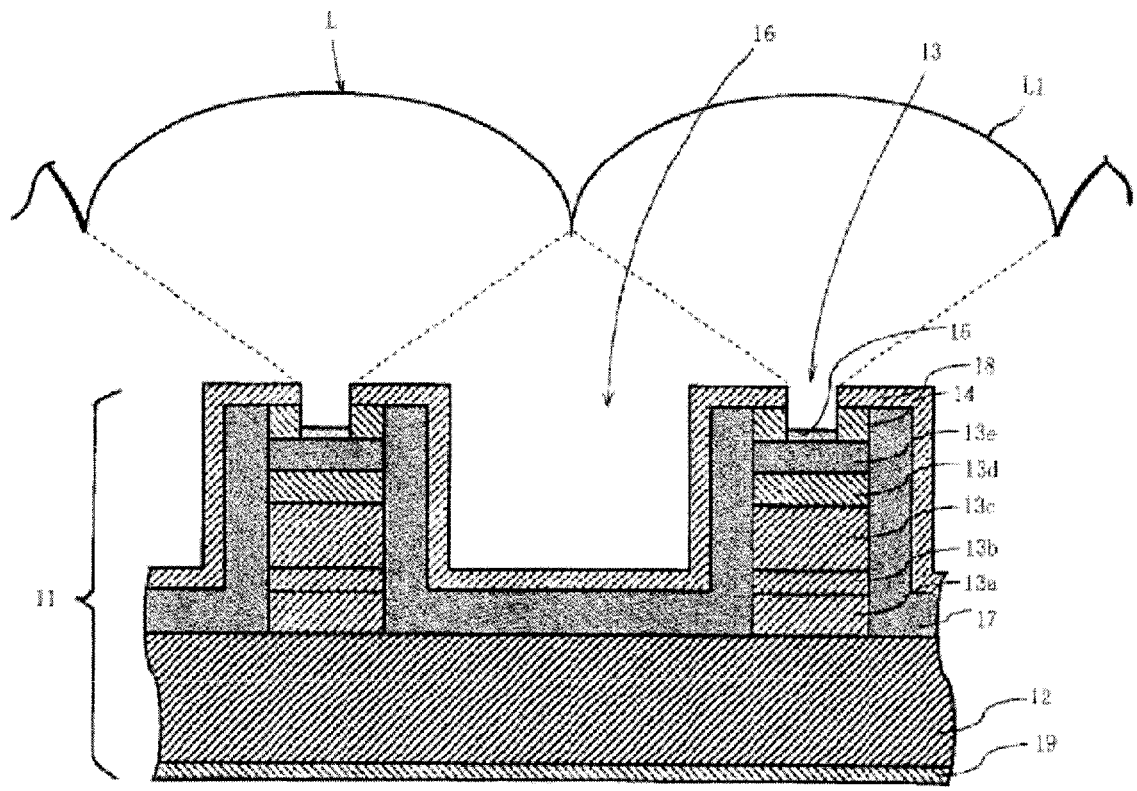
FIG. 7 shows a cross-sectional view of the solar cell disclosed in Patent Literature 1 (Japanese Patent Laid-Open Publication No. 2008-124381)

When the insulation film 122 is used, as shown in FIG. 5, the insulation film 122 is covered with a metal film 131. The metal film 131 improves heat radiation property of the solar cell element 102.

It is desirable that the metal film 131 is electrically connected with the p-side electrode 121 and that the metal film 131 and the n-type electrode 120 are exposed on one surface (in FIG. 5, the bottom surface).

(Method for Fabricating the Solar Cell Element 102)

A method for fabricating the solar cell element 102 is described below with reference to FIGS. 3A-3E and FIGS. 4A-4D.

Figure 3A:
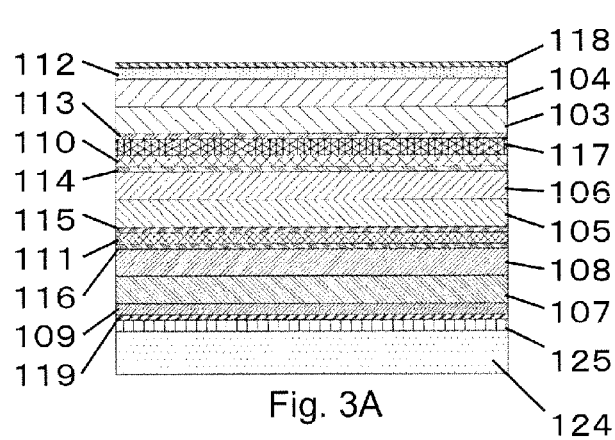
FIG. 3A shows one step included in the method for fabricating a solar cell element according to the embodiment.

First, as shown in FIG. 3A, a sacrificial layer 125, the p-type electric contact layer 119, the window layer 109, the p-type InGaP layer 107, the n-type InGaP layer 108, the third n-type barrier layer 116, the second tunnel junction layer 111, the second p-type barrier layer 115, the p-type GaAs layer 105, the n-type GaAs layer 106, the second n-type barrier layer 114, the first tunnel junction layer 110, the buffer layer 117, the first p-type barrier layer 113, the p-type InGaAs layer 103, the n-type InGaAs layer 104, the first n-type barrier layer 112, and the n-type electric contact layer 118 are grown on a surface of a GaAs substrate 124 in this order by a conventional semiconductor growth method such as a molecular beam epitaxy method or a metal organic chemical vapor deposition method (hereinafter, referred to as "MOCVD method"). The sacrificial layer 125 has a lattice constant which is close to that of GaAs. The sacrificial layer 125 is a layer to be etched selectively with regard to GaAs. An example of the material of the sacrificial layer 125 is AlAs or InGaP.

Figure 3D:
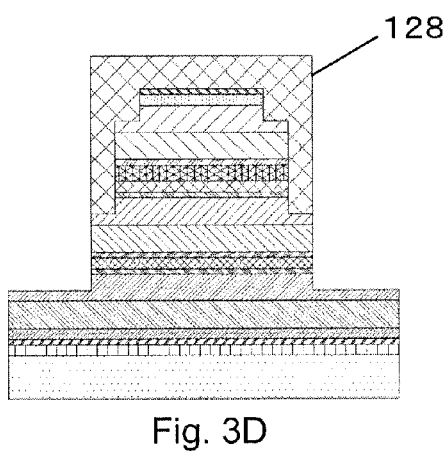
FIG. 3D shows one step included in the method for fabricating a solar cell element according to the embodiment, subsequently to FIG. 3C.
Figure 3B:
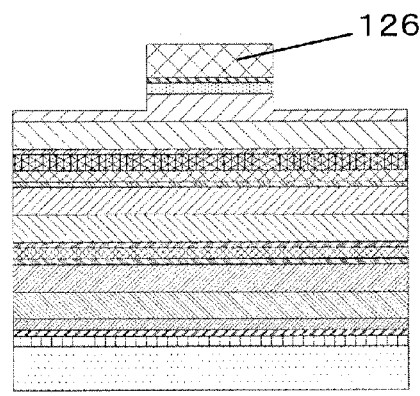
FIG. 3B shows one step included in the method for fabricating a solar cell element according to the embodiment, subsequently to FIG. 3A.

Then, as shown in FIG. 3B, a first mask 126 is formed on the n-type electric contact layer 118. The first mask 126 has a width identical to the value of w1. Using the first mask 126, an unnecessary portion of the n-type electric contact layer 118 and an unnecessary portion of the first n-type barrier layer 112 are etched. Furthermore, an upper portion of the peripheral part of the n-type in GaAs layer 104 is etched. The etching depth of the n-type in GaAs layer 104 is the same as the thickness of (d1-d3) shown in FIG. 2. For the etching, a gaseous mixture of $BCl_3$ and $SF_6$ can be used.

Figure 3E:
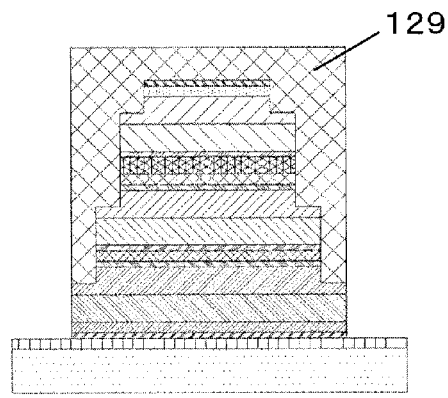
FIG. 3E shows one step included in the method for fabricating a solar cell element according to the embodiment, subsequently to FIG. 3D.
Figure 3C:
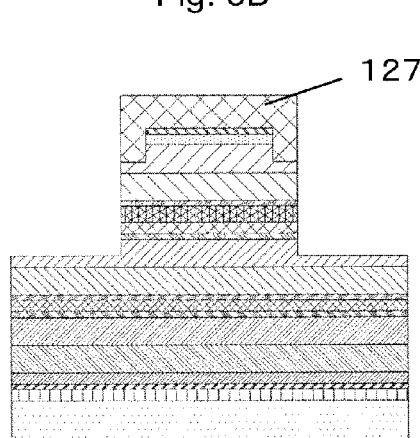
FIG. 3C shows one step included in the method for fabricating a solar cell element according to the embodiment, subsequently to FIG. 3B.

As shown in FIG. 3C, the first mask 126 is removed, and a second mask 127 is formed. The width of the second mask 127 is the same as the value of (w1+w2+w3) shown in FIG. 2. Using the second mask 127, unnecessary portions of the n-type InGaAs layer 104, the p-type InGaAs layer 103, the first p-type barrier layer 113, the first tunnel junction layer 110, and the second n-type barrier layer 114 are etched. Furthermore, the upper portion of the peripheral part of the n-type GaAs layer 106 is etched. The etching depth of the n-type GaAs layer 106 is the same as the thickness of (d4-d5) shown in FIG. 2.

As shown in FIG. 3D, the second mask 127 is removed, and a third mask 128 is 13 formed. The width of the third mask 128 is the same as the value of (w1+w2+w3+w4+w5)

shown in FIG. 2. Using the third mask 128, unnecessary portions of the n-type GaAs layer 106, the p-type GaAs layer 105, the second p-type barrier layer 115, the second tunnel junction layer 111, and the third n-type barrier layer 116 are etched. Furthermore, the upper portion of the peripheral part of the n-type InGaP layer 108 is etched. The etching depth of the n-type InGaP layer 108 is the same as the thickness of (d7-d8) shown in FIG. 2.

As shown in FIG. 3E, the third mask 128 is removed, and a fourth mask 129 is formed. The width of the fourth mask 129 is the same as the value of (w1+w2+w3+w4+w5+w6+w7) shown in FIG. 2. Using the fourth mask 129, unnecessary portions of the n-type InGaP layer 108, the p-type InGaP layer 107, the window layer 109, and the n-type electric contact layer 118 are etched.

Figure 4A:
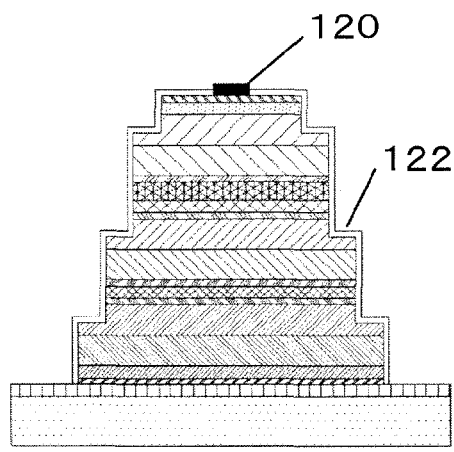
FIG. 4A shows one step included in the method for fabricating a solar cell element according to the embodiment, subsequently to FIG. 3E.

As shown in FIG. 4A, the fourth mask 129 is removed. The n-side electrode 120 and the insulator film 122 are formed. An example of a method for forming the n-side electrode 120 is a sputtering method or an electron beam evaporation method. An example of a method for forming the insulator film 122 is a sputtering method or a chemical vapor deposition method.

Figure 4B:
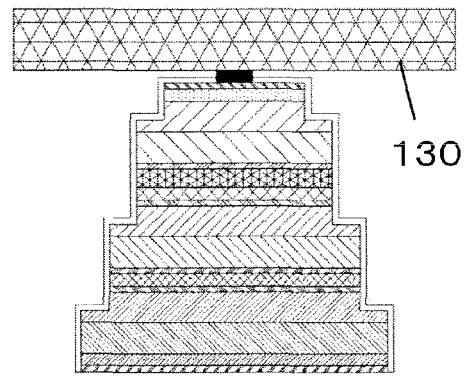
FIG. 4B shows one step included in the method for fabricating a solar cell element according to the embodiment, subsequently to FIG. 4A.

As shown in FIG. 4B, a base substrate 130 is equipped with the n-side electrode 120. The GaAs substrate 124 and the sacrificial layer 125 are removed by etching. An example of the base substrate 130 is a silicon substrate or a glass substrate. A wax film or an adhesion sheet may be interposed optionally between the n-side electrode 120 and the base substrate 130.

Figure 4C:
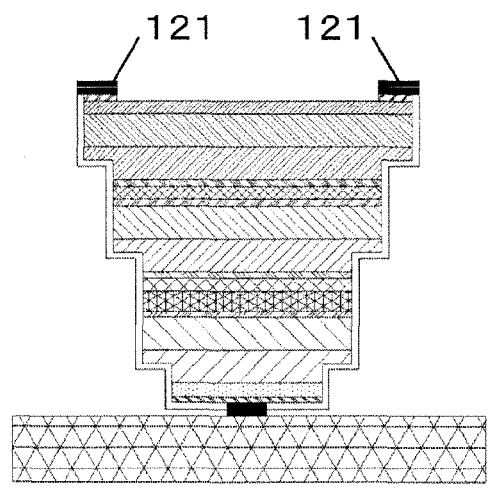
FIG. 4C shows one step included in the method for fabricating a solar cell element according to the embodiment, subsequently to FIG. 4B.

As shown in FIG. 4C, the p-side electrode 121 is formed on the p-type electric contact layer 119. Furthermore, a portion of the p-type electric contact layer 119 which is not in contact with the p-side electrode 121 is removed by etching. An example of a method for forming the p-side electrode 121 is a sputtering method or an electron beam evaporation method.

Figure 4D:
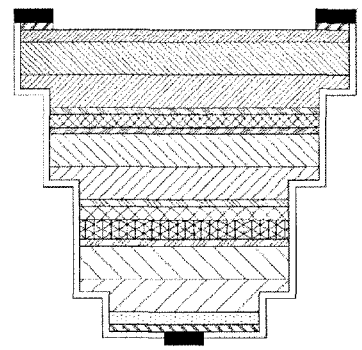
FIG. 4D shows one step included in the method for fabricating a solar cell element according to the embodiment, subsequently to FIG. 4C.

Finally, as shown in FIG. 4D, the base substrate 130 is removed. In this way, the solar cell element 102 is obtained. As shown in FIG. 1A, the obtained solar cell element 102 is equipped with the condenser lens 101. In this way, the solar cell is provided.

(Step (b))

In the step (b), the window layer 109 is irradiated with light which passes through the condenser lens 101 to generate a voltage difference between the n-side electrode 120 and the p-side electrode 121. As shown in FIG. 2, a range S of window layer 109 is irradiated with the light 123.

The present inventors discovered that the following inequation (II) is required to be satisfied in the step (b).

w8≤w1 (II)

As described above, the value of w1 represents the width of the InGaAs center part 104a along the X direction.

The value of w8 represents the width of the range S along the X direction.

When viewed along the Z direction, the InGaAs center part 104a overlaps the range S.

In case where the inequation (II) is not satisfied, the higher photoelectric conversion efficiency is not achieved (See the comparative examples 18-21).

As shown in FIG. 2B, when the following equation: (w1+w2+w3+w4+w5+w6+w7)=(w8+w9+w10) is satisfied, the width w9 is equal to or more than width (w2+w4+w6), and width w10 is equal to or more than width (w3+w5+w7). The width w9 and the width w10 represent widths of portions of the window layer 109 which are not irradiated with light.

EXAMPLES

The following examples describe the present disclosure in more detail.

Example 1

In the example 1, the solar cell element 102 shown in FIG. 2 was fabricated in accordance with the method shown in FIG. 3A-FIG. 3E and FIG. 4A-FIG. 4D.

Table 1 shows the composition and film thickness of each layer provided in the solar cell element 102 according to the example 1.

TABLE 1

| Layer | Composition | Dopant Type | Concentration [cm$^{-3}$] | Film thickness [unit: micrometer] |
|---|---|---|---|---|
| n-type electric contact layer 118 | GaAs | Te | $2.0 \times 10^{19}$ | 0.1 |
| First n-type barrier layer 112 | In$_{0.75}$Ga$_{0.25}$P | Si | $1.0 \times 10^{19}$ | 0.05 |
| n-type InGaAs layer 103 | In$_{0.3}$Ga$_{0.7}$As | Si | $1.0 \times 10^{18}$ | 2.9 |
| p-type InGaAs layer 104 | In$_{0.3}$Ga$_{0.7}$As | Zn | $1.0 \times 10^{18}$ | 0.1 |
| First p-type barrier layer 113 | In$_{0.75}$Ga$_{0.25}$P | Zn | $1.0 \times 10^{19}$ | 0.05 |
| Buffer layer 117 | In$_{1-x}$Ga$_x$P (x = 0.51 – 0.22) | Zn | $2.0 \times 10^{18}$ | 3.0 |
| First tunnel junction layer 110 | GaAs | C | $1.0 \times 10^{20}$ | 0.02 |
|  | Al$_{0.3}$Ga$_{0.7}$As | Te | $1.0 \times 10^{19}$ | 0.012 |
| Second n-type barrier layer 114 | In$_{0.49}$Ga$_{0.51}$P | Si | $1.0 \times 10^{19}$ | 0.05 |
| n-type GaAs layer 106 | GaAs | Si | $1.0 \times 10^{18}$ | 2.5 |
| p-type GaAs layer 105 | GaAs | Si | $1.0 \times 10^{18}$ | 0.1 |
| Second p-type barrier layer 115 | In$_{0.49}$Ga$_{0.51}$P | Zn | $1.0 \times 10^{19}$ | 0.1 |
| Second tunnel junction layer 111 | GaAs | C | $1.0 \times 10^{20}$ | 0.02 |
|  | Al$_{0.3}$Ga$_{0.7}$As | Te | $1.0 \times 10^{19}$ | 0.012 |
| Third n-type barrier layer 116 | In$_{0.49}$Ga$_{0.51}$P | Si | $1.0 \times 10^{19}$ | 0.1 |
| n-type InGaP layer 108 | In$_{0.49}$Ga$_{0.51}$P | Si | $1.0 \times 10^{18}$ | 0.9 |
| p-type InGaP layer 107 | In$_{0.49}$Ga$_{0.51}$P | Zn | $3.0 \times 10^{17}$ | 0.1 |
| Window layer 109 | In$_{0.49}$Al$_{0.25}$Ga$_{0.26}$P | Zn | $1.0 \times 10^{19}$ | 0.025 |
| p-type contact layer 119 | GaAs | Zn | $1.0 \times 10^{19}$ | 0.1 |
| Sacrificial layer 125 | AlAs | — | — | 0.1 |
| Substrate 124 | GaAs | — | — | 350 |

The values of d1-d9 and w1-w7 in the example 1 are described below.

d1: 2.9 micrometers
d2: 4 nanometers
d3: 4 nanometers
d4: 2.5 micrometers
d5: 4 nanometers
d6: 4 nanometers
d7: 0.9 micrometers
d8: 4 nanometers
d9: 4 nanometers
w1: 70 micrometers
w2: 5 micrometers
w3: 5 micrometers
w4: 5 micrometers
w5: 5 micrometers
w6: 5 micrometers
w7: 5 micrometers The condenser lens 101 according to the example 1 had a thickness of 3 millimeters. The bottom of the condenser lens 101 was 3 millimeters square. The condenser lens 101 had a focal spot of 70 micrometers square.

The solar cell according to the example 1 was fabricated as below.

First, as shown in FIG. 3A, the layers 104-125 were grown on the non-doped GaAs substrate 124 by an MOCVD method.

Then, as shown in FIG. 3B, a resist film of 70 micrometers square was formed on the n-type electric contact layer 118 by a photolithography method. Using this resist film as the first mask 126, an unnecessary portion of the n-type electric contact layer 118 and an unnecessary portion of the first n-type barrier layer 112 were removed by an ICP plasma etching method using a gaseous mixture of $BCl_3$ and $SF_6$. Furthermore, using the same gas mixture, almost all of the peripheral parts of the n-type InGaAs layer 104 were etched in such a manner that the peripheral part of the n-type InGaAs layer 104 was left slightly.

After the etching, the thickness of the left peripheral part of the n-type InGaAs layer 104 was measured with a transmission electron microscope. As a result, the thickness was 4 nanometers.

The first mask 126 was removed using a resist stripper liquid. Subsequently, a resist film of 80 micrometers square was formed as the second mask 127. The center of the resist film corresponded with the center of the first mask 126.

Using the second mask 127, unnecessary portions of the n-type InGaAs layer 104, the p-type in GaAs layer 103, the first p-type barrier layer 113, the first tunnel junction layer 110, and the second n-type barrier layer 114 were etched. Furthermore, as shown in FIG. 3C, almost all of the peripheral parts of the n-type GaAs layer 106 were etched in such a manner that the peripheral part of the n-type GaAs layer 106 was left slightly.

After the etching, the thickness for the left peripheral part of the n-type GaAs layer 106 was measured with the transmission electron microscope. The thickness was 4 nanometers.

The second mask 127, was removed using a resist stripper, liquid. After the removal, a resist film of 90 micrometers square was formed as the third mask 128. The center of the resist film corresponds with the center of the first mask 126 and with the center of the second mask 127.

Using the third mask 128, unnecessary portions of the n-type GaAs layer 106, the p-type GaAs layer 105, the second p-type barrier layer 115, the second tunnel junction layer 111, and the third n-type barrier layer 116 were etched. Furthermore, as shown in FIG. 3D, almost all of the peripheral parts of the n-type InGaP layer 108 were etched in such a manner that the peripheral part of the n-type InGaP layer 108 was left slightly.

After the etching, the thickness of the left peripheral part of the n-type InGaP layer 108 was measured with the transmission electron microscope. The thickness was 4 nanometers.

The third mask 128 was removed using a resist stripper liquid. After the removal, a resist film of 100 micrometers square was formed as a fourth mask 129. The center of the resist film corresponds with the centers of the first mask 126, the second mask 127, and the third mask 128.

Using the fourth mask 129, as shown in FIG. 3E, unnecessary portions of the n-type InGaP layer 108, the p-type InGaP layer 107, the window layer 109, and the n-type electric contact layer 118 were etched to expose the sacrificial layer 125.

The fourth mask 129 was removed using a resist stripper liquid. After the removal, as shown in FIG. 4A, a titanium film having a thickness of 50 nanometers and a gold film having a thickness of 250 nanometers were stacked on the n-type electric contact layer 118 with an electron beam evaporation equipment to form the n-side electrode 120.

Then, as shown in FIG. 4A, the insulator film 122 consisting of a SiN film having a thickness of 400 nanometers was formed with a plasma chemical vapor deposition equipment.

Wax was applied using a spin coater to the surface where the n-side electrode 120 was formed. After the wax was dried, the n-side electrode 120 was fixed to a glass base substrate 130.

After the n-side electrode 120 was fixed, the GaAs substrate 124 was removed with use of a liquid mixture of citric acid and hydrogen peroxide. Subsequently, the sacrificial layer 125 was removed with use of buffered hydrofluoric acid to expose the p-type contact layer 119. Thus, the structure shown in FIG. 4B was obtained.

As shown in FIG. 4C, a titanium film having a thickness of 50 nanometers, a platinum film having a thickness of 150 nanometers, and a gold film having a thickness of 250 nanometers were formed in this order on the p-type electric contact layer 119 with the electron beam evaporation equipment to form the p-side electrode 121. Furthermore, a portion of the p-type contact layer 119 which was not in contact with the p-side electrode 121 was removed by etching.

After the etching, the wax was dissolved with isopropanol to remove the base substrate 130. In this way, the solar cell element 102 shown in FIG. 4D was obtained.

The obtained solar cell element 102 was attached to the condenser lens 101 in such a manner that the center of the focus position of the condenser lens 101 corresponded with the center of the solar cell element 102. In this manner, the solar cell according to the example 1 was obtained.

The solar cell according to the example 1 was irradiated with sunlight under the condition that w8=70 micrometers and w9=w10=15 micrometers. The volt-ampere characteristics of the solar cell according to the example 1 were measured, and the photoelectric conversion efficiency was calculated. Table 2-1 shows the results of the example 1 together with the results according to the examples 2-17 and Table 2-2 shows the results of the comparative examples 1-21, which are described later.

The conversion efficiency was calculated according to the following equation (I):

(Conversion efficiency)=(Maximum output value from the solar cell)/(Energy of the sunlight)     (I)

The maximum output value described in the above-mentioned equation (I) denotes maximum the value of the output value defined by the following equation (II):

(Output value)=(Current density obtained from the solar cell)·(Bios voltage from the solar cell)     (II)

For more detail, see the pages 11-13 disclosed in Non Patent Literature 1 (Jenny Nelson, "The Physics of Solar Cells", World Scientific Pub. Co. Inc.)

TABLE 2-1

Unit of d1-d9 and w1-w10: micrometer

| | d1 | d2 (=d3) | d4 | d5 (=d6) | d7 | d8 (=d9) | w1 | w2 (=w3) | w4 (=w5) | w6 (=w7) | w8 | w9 (=w10) | Conversion efficiency [%] |
|---|---|---|---|---|---|---|---|---|---|---|---|---|---|
| Example 1 | 2.9 | 0.004 | 2.5 | 0.004 | 0.9 | 0.004 | 70 | 5 | 5 | 5 | 70 | 15 | 34.78 |
| Example 2 | 2.9 | 0.002 | 2.5 | 0.004 | 0.9 | 0.004 | 70 | 5 | 5 | 5 | 70 | 15 | 34.91 |
| Example 3 | 2.9 | 0.001 | 2.5 | 0.004 | 0.9 | 0.004 | 70 | 5 | 5 | 5 | 70 | 15 | 34.93 |
| Example 4 | 2.9 | 0.004 | 2.5 | 0.002 | 0.9 | 0.004 | 70 | 5 | 5 | 5 | 70 | 15 | 34.84 |
| Example 5 | 2.9 | 0.004 | 2.5 | 0.001 | 0.9 | 0.004 | 70 | 5 | 5 | 5 | 70 | 15 | 34.86 |
| Example 6 | 2.9 | 0.004 | 2.5 | 0.004 | 0.9 | 0.005 | 70 | 5 | 5 | 5 | 70 | 15 | 34.69 |
| Example 7 | 2.9 | 0.004 | 2.5 | 0.004 | 0.9 | 0.002 | 70 | 5 | 5 | 5 | 70 | 15 | 34.80 |
| Example 8 | 2.9 | 0.004 | 2.5 | 0.004 | 0.9 | 0.001 | 70 | 5 | 5 | 5 | 70 | 15 | 34.62 |
| Example 9 | 2.9 | 0.004 | 2.5 | 0.004 | 0.9 | 0.004 | 79.8 | 0.1 | 5 | 5 | 70 | 15 | 34.34 |
| Example 10 | 2.9 | 0.004 | 2.5 | 0.004 | 0.9 | 0.004 | 79 | 0.5 | 5 | 5 | 70 | 15 | 34.45 |
| Example 11 | 2.9 | 0.004 | 2.5 | 0.004 | 0.9 | 0.004 | 79.8 | 5 | 0.1 | 5 | 70 | 15 | 34.38 |
| Example 12 | 2.9 | 0.004 | 2.5 | 0.004 | 0.9 | 0.004 | 79 | 5 | 0.5 | 5 | 70 | 15 | 34.49 |
| Example 13 | 2.9 | 0.004 | 2.5 | 0.004 | 0.9 | 0.004 | 79.8 | 5 | 5 | 0.1 | 70 | 15 | 34.33 |
| Example 14 | 2.9 | 0.004 | 2.5 | 0.004 | 0.9 | 0.004 | 79 | 5 | 5 | 0.5 | 70 | 15 | 34.35 |
| Example 15 | 2.9 | 0.004 | 2.5 | 0.004 | 0.9 | 0.004 | 70 | 5 | 5 | 5 | 66 | 17 | 34.75 |
| Example 16 | 2.9 | 0.004 | 2.5 | 0.004 | 0.9 | 0.004 | 40 | 10 | 10 | 10 | 40 | 30 | 34.45 |
| Example 17 | 2.9 | 0.004 | 2.5 | 0.004 | 0.9 | 0.004 | 40 | 10 | 10 | 10 | 36 | 32 | 34.31 |

TABLE 2-2

| | d1 | d2 (=d3) | d4 | d5 (=d6) | d7 | d8 (=d9) | w1 | w2 (=w3) | w4 (=w5) | w6 (=w7) | w8 | w9 (=w10) | Conversion efficiency [%] |
|---|---|---|---|---|---|---|---|---|---|---|---|---|---|
| Comparative Example 1 | 2.9 | 2.9 | 2.5 | 2.5 | 0.9 | 0.9 | 70 | 5 | 5 | 5 | 100 | 0 | 30.48 |
| Comparative Example 2 | 2.9 | 2.9 | 2.5 | 2.5 | 0.9 | 0.9 | 70 | 5 | 5 | 5 | 70 | 15 | 32.96 |
| Comparative Example 3 | 2.9 | 0.004 | 2.5 | 0.004 | 0.9 | 0.004 | 70 | 5 | 5 | 5 | 100 | 0 | 26.81 |
| Comparative Example 4 | 2.9 | 0.1 | 2.5 | 0.004 | 0.9 | 0.004 | 70 | 5 | 5 | 5 | 70 | 15 | 32.14 |
| Comparative Example 5 | 2.9 | 0.01 | 2.5 | 0.004 | 0.9 | 0.004 | 70 | 5 | 5 | 5 | 70 | 15 | 32.39 |
| Comparative Example 6 | 2.9 | 0.005 | 2.5 | 0.004 | 0.9 | 0.004 | 70 | 5 | 5 | 5 | 70 | 15 | 32.86 |
| Comparative Example 7 | 2.9 | 0 | 2.5 | 0.004 | 0.9 | 0.004 | 70 | 5 | 5 | 5 | 70 | 15 | 32.41 |
| Comparative Example 8 | 2.9 | 0.004 | 2.5 | 0.1 | 0.9 | 0.004 | 70 | 5 | 5 | 5 | 70 | 15 | 31.67 |
| Comparative Example 9 | 2.9 | 0.004 | 2.5 | 0.01 | 0.9 | 0.004 | 70 | 5 | 5 | 5 | 70 | 15 | 31.92 |
| Comparative Example 10 | 2.9 | 0.004 | 2.5 | 0.005 | 0.9 | 0.004 | 70 | 5 | 5 | 5 | 70 | 15 | 32.37 |
| Comparative Example 11 | 2.9 | 0.004 | 2.5 | 0 | 0.9 | 0.004 | 70 | 5 | 5 | 5 | 70 | 15 | 31.93 |
| Comparative Example 12 | 2.9 | 0.004 | 2.5 | 0.004 | 0.9 | 0.1 | 70 | 5 | 5 | 5 | 70 | 15 | 32.59 |
| Comparative Example 13 | 2.9 | 0.004 | 2.5 | 0.004 | 0.9 | 0.01 | 70 | 5 | 5 | 5 | 70 | 15 | 32.53 |
| Comparative Example 14 | 2.9 | 0.004 | 2.5 | 0.004 | 0.9 | 0 | 70 | 5 | 5 | 5 | 70 | 15 | 32.56 |

TABLE 2-2-continued

| | d1 | d2 (=d3) | d4 | d5 (=d6) | d7 | d8 (=d9) | w1 | w2 (=w3) | w4 (=w5) | w6 (=w7) | w8 | w9 (=w10) | Conversion efficiency [%] |
|---|---|---|---|---|---|---|---|---|---|---|---|---|---|
| Comparative Example 15 | 2.9 | 0.004 | 2.5 | 0.004 | 0.9 | 0.004 | 79.9 | 0.05 | 5 | 5 | 70 | 15 | 31.60 |
| Comparative Example 16 | 2.9 | 0.004 | 2.5 | 0.004 | 0.9 | 0.004 | 79.9 | 5 | 0.05 | 5 | 70 | 15 | 32.62 |
| Comparative Example 17 | 2.9 | 0.004 | 2.5 | 0.004 | 0.9 | 0.004 | 79.9 | 5 | 5 | 0.05 | 70 | 15 | 32.07 |
| Comparative Example 18 | 2.9 | 0.004 | 2.5 | 0.004 | 0.9 | 0.004 | 70 | 5 | 5 | 5 | 78 | 11 | 29.02 |
| Comparative Example 19 | 2.9 | 0.004 | 2.5 | 0.004 | 0.9 | 0.004 | 70 | 5 | 5 | 5 | 74 | 13 | 32.32 |
| Comparative Example 20 | 2.9 | 0.004 | 2.5 | 0.004 | 0.9 | 0.004 | 40 | 10 | 10 | 10 | 48 | 26 | 26.84 |
| Comparative Example 21 | 2.9 | 0.004 | 2.5 | 0.004 | 0.9 | 0.004 | 40 | 10 | 10 | 10 | 44 | 28 | 31.09 |

Example 2

The experiment similar to that of the example 1 was performed, except that $d2=d3=2$ nanometers.

Example 3

The experiment similar to that of the example 1 was performed, except that $d2=d3=1$ nanometer.

Example 4

The experiment similar to that of the example 1 was performed, except that $d5=d6=2$ nanometers.

Example 5

The experiment similar to that of the example 1 was performed, except that $d5=d6=1$ nanometer.

Example 6

The experiment similar to that of the example 1 was performed, except that $d8=d9=5$ nanometers.

Example 7

The experiment similar to that of the example 1 was performed, except that $d8=d9=2$ nanometers.

Example 8

The experiment similar to that of the example 1 was performed, except that $d8=d9=1$ nanometer.

Example 9

The experiment similar to that of the example 1 was performed, except that $w1=79.8$ micrometers and $w2=w3=0.1$ micrometer.

Example 10

The experiment similar to that of the example 1 was performed, except that $w1=79$ micrometers and $w2=w3=0.5$ micrometers.

Example 11

The experiment similar to that of the example 1 was performed, except that $w1=79.8$ micrometers and $w4=w5=0.1$ micrometer.

Example 12

The experiment similar to that of the example 1 was performed, except that $w1=79$ micrometers and $w4=w5=0.5$ micrometers.

Example 13

The experiment similar to that of the example 1 was performed, except that $w1=79.8$ micrometers and $w6=w7=0.1$ micrometer.

Example 14

The experiment similar to that of the example 1 was performed, except that $w1=79$ micrometers and $w6=w7=0.5$ micrometers.

Example 15

The experiment similar to that of the example 1 was performed, except that $w8=66$ micrometers and $w9=w10=17$ micrometers.

Example 16

The experiment similar to that of the example 1 was performed, except that $w1=40$ micrometers, $w2=w3=w4=w5=w6=w7=10$ micrometers, $w8=40$ micrometers, and $w9=w10=30$ micrometers.

Example 11

The experiment similar to that of the example 1 was performed, except that $w1=40$ micrometers, $w2=w3=w4=w5=w6=w7=10$ micrometers, $w8=36$ micrometers, and $w9=w10=32$ micrometers.

Comparative Example 1

The experiment similar to that of the example 1 was performed, except that $d2=d3=2.9$ micrometers, $d5=d6=2.5$ micrometers, $d8=d9=0.9$ micrometers, and $w8=100$ micrometers.

Comparative Example 2

The experiment similar to that of the example 1 was performed, except that $d2=d3=2.9$ micrometers, $d5=d6=2.5$ micrometers and $d8=d9=0.9$ micrometers.

Comparative Example 3

The experiment similar to that of the example 1 was performed, except that $w8=100$ micrometers.

Comparative Example 4

The experiment similar to that of the example 1 was performed, except that $d2=d3=0.1$ micrometer.

Comparative Example 5

The experiment similar to that of the example 1 was performed, except that $d2=d3=0.01$ micrometer.

Comparative Example 6

The experiment similar to that of the example 1 was performed, except that $d2=d3=0.005$ micrometers.

Comparative Example 7

The experiment similar to that of the example 1 was performed, except that $d2=d3=0$ micrometer.

Comparative Example 8

The experiment similar to that of the example 1 was performed, except that $d5=d6=0.1$ micrometer.

Comparative Example 9

The experiment similar to that of the example 1 was performed, except that $d5=d6=0.01$ micrometer.

Comparative Example 10

The experiment similar to that of the example 1 was performed, except that $d5=d6=0.005$ micrometers.

Comparative Example 11

The experiment similar to that of the example 1 was performed, except that $d5=d6=0$ micrometer.

Comparative Example 12

The experiment similar to that of the example 1 was performed, except that $d8=d9=0.1$ micrometer.

Comparative Example 13

The experiment similar to that of the example 1 was performed, except that $d8=d9=0.01$ micrometer.

Comparative Example 14

The experiment similar to that of the example 1 was performed, except that $d8=d9=0$ micrometer.

Comparative Example 15

The experiment similar to that of the example 1 was performed, except that $w1=79.9$ micrometers and $w2=w3=0.05$ micrometers.

Comparative Example 16

The experiment similar to that of the example 1 was performed, except that $w1=79.9$ micrometers and $w4=w5=0.05$ micrometers.

Comparative Example 17

The experiment similar to that of the example 1 was performed, except that $w1=79.9$ micrometers and $w6=w7=0.05$ micrometers.

Comparative Example 18

The experiment similar to that of the example 1 was performed, except that $w8=78$ micrometers and $w9=w10=11$ micrometers.

Comparative Example 19

The experiment similar to that of the example 1 was performed, except that $w6=74$ micrometers and $w9=w10=13$ micrometers.

Comparative Example 20

The experiment similar to that of the example 1 was performed, except that $w1=40$ micrometers, $w2=w3=w4=w5=w6=w7=10$ micrometers, $w8=48$ micrometers, and $w9=w10=26$ micrometers.

Comparative Example 21

The experiment similar to that of the example 1 was performed, except that $w1=40$ micrometers, $w2=w3=w4=w5=w6=w7=10$ micrometers, $w8=44$ micrometers, and $w9=w10=28$ micrometers.

As is clear from Table 2-1 and Table 2-2, when the following inequation set (III) is satisfied, the solar cell has high photoelectric conversion efficiency of not less than 34%.

(III)
$d2<d1$,
$d3<d1$,
1 nanometer$\leq d2 \leq$4 nanometers,
1 nanometer$\leq d3 \leq$4 nanometers,
$d5<d4$,
$d6<d4$,
1 nanometer$\leq d5 \leq$5 nanometers,
1 nanometer$\leq d6 \leq$5 nanometers,
$d8<d7$,
$d9<d7$,
1 nanometer$\leq d8 \leq$5 nanometers,
1 nanometer$\leq d9 \leq$5 nanometers,
100 nanometers$\leq w2$,
100 nanometers$\leq w3$,
100 nanometers$\leq w4$,
100 nanometers$\leq w5$,
100 nanometers$\leq w6$,
100 nanometers$\leq w7$ and
$w8 \leq w1$ The examples 1-17 and the comparative examples 1-2 reveal that it is necessary that the following inequality set is satisfied.

d2<d1,
d3<d1,
d5<d4,
d6<d4,
d8<d7, and
d9<d7

The examples 1-3 and the comparative examples 4-7 reveal that it is necessary that the following inequality set is satisfied.

1 nanometer≤d2≤4 nanometers and
1 nanometer≤d3≤4 nanometers

The examples 1, 4-5 and the comparative examples 8-11 reveal that it is necessary that the following inequality set is satisfied.

1 nanometer≤d5≤4 nanometers and
1 nanometer≤d6≤4 nanometers

The examples 1, 6-8 and the comparative examples 12-14 reveal that it is necessary that the following inequality set is satisfied.

1 nanometer≤d8≤5 nanometers and
1 nanometer≤d9≤5 nanometers

The examples 9-10 and the comparative example 15 reveal that it is necessary that the following inequality set is satisfied.

100 nanometers≤w2 and
100 nanometers≤w3

The examples 11-12 and the comparative example 16 reveal that it is necessary that the following inequality set is satisfied.

100 nanometers≤w4 and
100 nanometers≤w5

The examples 13-14 and the comparative example 17 reveal that it is necessary that the following inequality set is satisfied.

100 nanometers≤w6 and
100 nanometers≤w7

The examples 1, 15-17 and the comparative examples 18-21 reveal that it is necessary that the following inequality is satisfied.

w8≤w1

The present disclosure provides a solar cell having higher photoelectric conversion efficiency.

The invention claimed is:

1. A method for generating an electric power using a solar cell, the method comprising:
  (a) preparing the solar cell comprising a condenser lens and a solar cell element;
  wherein the solar cell element comprises an n-type InGaAs layer, a p-type InGaAs layer, an n-type GaAs layer, a p-type GaAs layer-, an n-type InGaP layer, a p-type InGaP layer, a first tunnel junction layer, a second tunnel junction layer, a window layer, an n-side electrode, and a p-side electrode;
  Z direction is a normal line direction of the p-type InGaAs layer;
  X direction is perpendicular to the Z direction;
  the n-type InGaAs layer, the p-type InGaAs layer, the first tunnel junction layer, the n-type GaAs layer, the p-type GaAs layer, the second tunnel junction layer, the n-type InGaP layer, the p-type InGaP layer, and the window layer are stacked in this order along the Z direction;
  the n-side electrode is connected electrically to the n-type InGaAs layer;
  the p-side electrode is connected electrically to the p-type InGaP layer;
  the n-type InGaAs layer is divided into an InGaAs center part, a first InGaAs peripheral part, and a second InGaAs peripheral part;
  the InGaAs center part is interposed between the first InGaAs peripheral part and the second InGaAs peripheral part along the X direction;
  the first InGaAs peripheral part and the second InGaAs peripheral part have a shape of a layer;
  the n-type GaAs layer is divided into a GaAs center part, a first GaAs peripheral part, and a second GaAs peripheral part;
  the GaAs center part is interposed between the first GaAs peripheral part and the second GaAs peripheral part along the X direction;
  the first GaAs peripheral part and the second GaAs peripheral part have a shape of a layer;
  the n-type InGaP layer is divided into an InGaP center part, a first InGaP peripheral part, and a second InGaP peripheral part;
  the InGaP center part is interposed between the first InGaP peripheral part and the second InGaP peripheral part along the X direction;
  the first InGaP peripheral part and the second InGaP peripheral part have a shape of a layer;
  the following inequation set (I) is satisfied;
  (I)
  d2<d1,
  d3<d1,
  1 nanometer≤d2≤4 nanometers,
  1 nanometer≤d3≤4 nanometers,
  d5<d4,
  d6<d4,
  1 nanometer≤d5≤4 nanometers,
  1 nanometer≤d6≤4 nanometers,
  d8<d7,
  d9<d7,
  1 nanometer≤d8≤5 nanometers,
  1 nanometer≤d9≤5 nanometers,
  100 nanometers≤w2,
  100 nanometers≤w3,
  100 nanometers≤w4,
  100 nanometers≤w5,
  100 nanometers≤w6, and
  100 nanometers≤w7
  d1 represents a thickness of the InGaAs center part along the Z direction;
  d2 represents a thickness of the first InGaAs peripheral part along the Z direction;
  d3 represents a thickness of the second InGaAs peripheral part along the Z direction;
  d4 represents a thickness of the GaAs center part along the Z direction;
  d5 represents a thickness of the first GaAs peripheral part along the Z direction;
  d6 represents a thickness of the second GaAs peripheral part along the Z direction;
  d7 represents a thickness of the InGaP center part along the Z direction;
  d8 represents a thickness of the first InGaP peripheral part along the Z direction;
  d9 represents a thickness of the second InGaP peripheral part along the Z direction;
  w2 represents a width of the first InGaAs peripheral part along the X direction;

w3 represents a width of the second InGaAs peripheral part along the X direction;
w4 represents a width of the first GaAs peripheral part along the X direction,
w5 represents a width of the second GaAs peripheral part along the X direction;
w6 represents a width of the first InGaP peripheral part along the X direction; and
w7 represents a width of the second InGaP peripheral part along the X direction;

(b) irradiating a region S which is included in the surface of the window layer through the condenser lens with light in such a manner that the following inequation (II) is satisfied so as to generate a voltage difference between the n-side electrode and the p-side electrode;

w8≤w1 (II)

where, w1 represents a width of the InGaAs center part along the X direction;
w8 represents a width of the range S along the X direction when viewed in the cross-sectional view which includes the Z direction; and the first center part overlaps the region S when viewed from the Z-direction.

2. The method according to claim 1, wherein the following equation is satisfied:

$$w1+w2+w3+w4+w5+w6+w7=w8+w9+w10$$

where, w9 and the width w10 represent widths of portions of the window layer which are not irradiated with the light.

3. The method according to claim 1, wherein sides of the n-type InGaAs layer, the p-type InGaAs layer, the first tunnel junction layer, the n-type GaAs layer, the p-type GaAs layer, the second tunnel junction layer, the n-type InGaP layer, the p-type InGaP layer and the p-type window layer are covered with an insulation layer.

4. A solar cell comprising a condenser lens and a solar cell element,
wherein the solar cell element comprises an n-type InGaAs layer, a p-type InGaAs layer, an n-type GaAs layer, a p-type GaAs layer, an n-type InGaP layer, a p-type InGaP layer, a first tunnel junction layer, a second tunnel junction layer, a window layer, an n-side electrode, and a p-side electrode;
Z direction is a normal line direction of the p-type InGaAs layer;
X direction is perpendicular to the Z direction;
the n-type InGaAs layer, the p-type InGaAs layer, the first tunnel junction layer, the n-type GaAs layer, the p-type GaAs layer, the second tunnel junction layer, the n-type InGaP layer, the p-type InGaP layer, and the window layer are stacked in this order along the Z direction;
the n-side electrode is connected electrically to the n-type InGaAs layer;
the p-side electrode is connected electrically to the p-type InGaP layer;
the n-type InGaAs layer is divided into an InGaAs center part, a first InGaAs peripheral part, and a second InGaAs peripheral part;
the InGaAs center part is interposed between the first InGaAs peripheral part and the second InGaAs peripheral part along the X direction;
the first InGaAs peripheral part and the second InGaAs peripheral part have a shape of a layer;
the n-type GaAs layer is divided into a GaAs center part, a first GaAs peripheral part, and a second GaAs peripheral part;
the GaAs center part is interposed between the first GaAs peripheral part and the second GaAs peripheral part along the X direction;
the first GaAs peripheral part and the second GaAs peripheral part have a shape of a layer;
the n-type InGaP layer is divided into an InGaP center part, a first InGaP peripheral part, and a second InGaP peripheral part;
the InGaP center part is interposed between the first InGaP peripheral part and the second InGaP peripheral part along the X direction;
the first InGaP peripheral part and the second InGaP peripheral part have a shape of a layer;
the following inequation set (I) is satisfied;

(I)
$d2<d1$,
$d3<d1$,
1 nanometer≤$d2$≤4 nanometers,
1 nanometer≤$d3$≤4 nanometers,
$d5<d4$,
$d6<d4$,
1 nanometer≤$d5$≤4 nanometers,
1 nanometer≤$d6$≤4 nanometers,
$d8<d7$,
$d9<d7$,
1 nanometer≤$d8$≤5 nanometers,
1 nanometer≤$d9$≤5 nanometers,
100 nanometers≤$w2$,
100 nanometers≤$w3$,
100 nanometers≤$w4$,
100 nanometers≤$w5$,
100 nanometers≤$w6$, and
100 nanometers≤$w7$ d1 represents a thickness of the InGaAs center part along the Z direction;
d2 represents a thickness of the first InGaAs peripheral part along the Z direction;
d3 represents a thickness of the second InGaAs peripheral part along the Z direction;
d4 represents a thickness of the GaAs center part along the Z direction;
d5 represents a thickness of the first GaAs peripheral part along the Z direction;
d6 represents a thickness of the second GaAs peripheral part along the Z direction;
d7 represents a thickness of the InGaP center part along the Z direction;
d8 represents a thickness of the first InGaP peripheral part along the Z direction;
d9 represents a thickness of the second InGaP peripheral part along the Z direction;
w2 represents a width of the first InGaAs peripheral part along the X direction;
w3 represents a width of the second InGaAs peripheral part along the X direction;
w4 represents a width of the first GaAs peripheral part along the X direction,
w5 represents a width of the second GaAs peripheral part along the X direction;
w6 represents a width of the first InGaP peripheral part along the X direction; and
w7 represents a width of the second InGaP peripheral part along the X direction.

* * * * *